United States Patent [19]

Bell

[11] 3,846,824

[45] Nov. 5, 1974

[54] IMPROVED THERMALLY CONDUCTIVE AND ELECTRICALLY INSULATIVE MOUNTING SYSTEMS FOR HEAT SINKS

[75] Inventor: Gordon M. Bell, Fort Wayne, Ind.

[73] Assignee: General Electric Company, Indianapolis, Ind.

[22] Filed: June 13, 1973

[21] Appl. No.: 369,700

[52] U.S. Cl. ...................... 357/80, 357/81, 317/101

[51] Int. Cl. ............................ H01l 3/00, H01l 5/00

[58] Field of Search ............ 317/234, 1, 1.5, 3, 3.1, 317/4, 4.1, 101

[56] References Cited

UNITED STATES PATENTS

| | | | |
|---|---|---|---|
| 3,058,041 | 10/1962 | Happ | 317/234 A |
| 3,275,921 | 9/1966 | Fellendorf | 317/234 A |
| 3,332,867 | 7/1967 | Miller et al. | 317/234 E |
| 3,396,361 | 8/1968 | Sussman | 317/234 A |
| 3,492,586 | 1/1970 | Leffmann | 317/234 A |
| 3,564,109 | 2/1971 | Ruechardt | 317/234 A |
| 3,735,209 | 5/1973 | Saddler | 317/234 H |

*Primary Examiner*—Andrew J. James

[57] ABSTRACT

A two-part adhesive system for mounting heat sinks to power supply cases. A heat sink made of some suitable material such as aluminum is provided having holes or slots for mounting semiconductors thereon. At least part of the heat sink is coated with a material which exhibits high thermal conductivity and high electrical insulating strength. The heat sink is adhered to the power supply case by an epoxy formulated adhesive material having granules placed therein for electrical spacing. The adhesive material also has high electrical insulating strength and high thermal conductivity. The adhesive material also forms a good mechanical bond.

14 Claims, 3 Drawing Figures

IMPROVED THERMALLY CONDUCTIVE AND ELECTRICALLY INSULATIVE MOUNTING SYSTEMS FOR HEAT SINKS

BACKGROUND OF THE INVENTION

This invention relates to an improved adhesive system for mounting electrical devices to a surface. More particularly it relates to a means for mounting electrical devices onto a heat sink which is further mounted onto a case with adhesive material, wherein the heat sink is coated with a highly thermal conductive and highly electric insulating material.

When using electrical components, especially solid state devices, in circuits where the ambient is at a high temperature it beocmes necessary to use a heat sink to avoid thermal destruction of the devices. This destruction could occur because the heat at a junction in the solid state device may become so high that it fuses. It is therefore necessary to attach the electrical device to the heat sink and further attach the heat sink to a surface so that a maximum amount of heat is dissipated. In the power supply art this surface may be the case of the supply. Also it is necessary that the system exhibit a high degree of electrical insulating strength so that the case of the power supply does not become exposed to high voltages.

It is also desirable to have an adhesive system for the heat sink which exhibits a high degree of mechanical strength. In the past heat sinks have been connected to the case of the power supply by nuts and bolts. Barium oxide (BaO) or mica wafers were placed between the solid state devices and the heat sink for electrical insulation. These BaO wafers made a good thermal conductor and a good electric insulator. One of the problems with using BaO wafers is that they are very fragile. They also must be placed onto the solid state device and to the bolt which holds the solid state device to the heat sink by hand. This was time consuming and many wafers were broken. Furthermore BaO is a toxic substance. Also in order to be effective the BaO wafer must be silver coated and further must be soldered to the solid state device. It can be seen then that the use of this type of electrical insulation was undesirable.

Another way of having reasonable electrical insulation and thermoconductivity was to use mica wavers connected between the solid state device and the heat sink. These mica wafers further were used in combination with a nylon collar which was connected between the screw which held the solid state device onto the heat sink and the edges of the mounting hole in heat sink. These mica wafers were very easy to puncture and furthermore the dielectric properties of mica were lost with age because of exposure to dirt in the air. Furthermore a thermoconductive paste must be applied between the mica wafer and both the heat sink and solid state device. Application of mica wafers was also a costly process.

SUMMARY OF THE INVENTION

Accordingly one object of this invention is to provide a system for mounting electrical devices having good electrical insulation, good heat conductivity and good mechanical bonding.

Another object is to use a two-part material adhesive system in attaching heat sinks to power supply cases rather than nuts and bolts.

Another object is to provide a heat sink for mounting semiconductors which is coated with the coating having high electrical insulation and high heat conductivity and an adhesive for connecting the heat sink to the case of a power supply having high electrical insulation and high heat conductivity and further having good mechanical bonding.

Another object is to provide a heat sink for solid state devices having a high degree of dielectric strength, low heat resistance and a good mechanical bond to the case of a power supply.

In accordance with one form of this invention there is provided an apparatus for mounting at least one electrical device to a surface.

The apparatus includes a heat sink for dissipating thermal energy. The heat sink provides a means for mounting at least one of the electrical devices to it. At least a portion of the heat sink is coated with a material exhibiting a high degree of electrical insulation and a high degree of thermal conductivity. The heat sink is attached to the surface by an adhesive material which covers at least a part of the heat sink. The adhesive material provides a mechanical bond between the heat sink and the surface and also exhibits a high degree of electrical insulation and a high degree of thermal conductivity.

DESCRIPTION OF THE PREFERRED EMBODIMENTS

Figure 1:
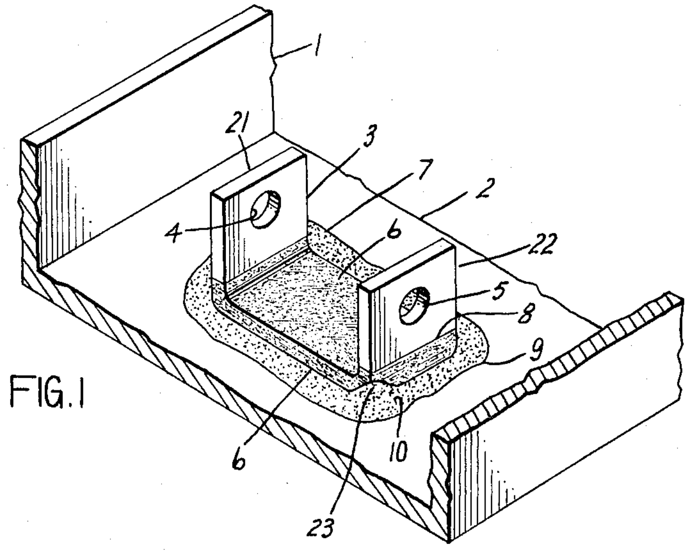
FIG. 1 is a diagram showing a U-shaped heat sink attached to a power supply case.

Referring now more particularly to FIG. 1 there is shown a portion of a power supply case 1. A U-shaped heat sink 3 is mounted on the inside bottom surface 2 of the power supply case. The heat sink has holes 4 and 5 drilled into opposite parallel portions 21 and 22 for mounting electrical devices such as semiconductors therein. The semiconductors may include SCR's, triacs, transistors, diodes and the like.

Semiconductor devices must be kept below a critical temperature in order to prevent malfunctions. In power supplies the ambient is often relatively high, therefore, heat should be readily conducted away from the semiconductor devices. A portion of the heat sink is coated with a material indicated by the shading at 6 which includes part of the side of the heat sink and part of upper surface of the heat sink. This material may be a fluidized bed coating and may be obtained commercially. The coating 6 is used to provide good thermal conductivity as well as a high degree of electrical insulation.

As shown in FIG. 1 the coating 6 extends around the sides of the U-shaped heat sink to a level indicated at 8. The coating also covers the large top flat portion of the heat sink as well as the bottom side.

Applicant desires to achieve in the neighborhood of 5000 volts of electrical insulation between a mounted electrical device of the case of the power supply. In order to do this as well as achieve sufficient thermal conductivity (low thermal resistance) certain combination of materials and thicknesses were needed for coating. A coating which worked well was an epoxy formulation which included from 35 to 50 percent silica filler by weight. The thickness ranges of the coating were between 0.006 and 0.010 inch.

The degree of electrical insulation which is measured by the dielectric strength was between 500 to 800 volts per 0.001 inch. The thermal conductivity which is measured by thermal resistance was 0.426° to 1.278°C per watt inch$^2$.

A commercially available material which worked well as a coating was 3M3620 made by the Minnesota, Mining, and Manufacturing Company. However, other materials may be used to achieve the same or different voltage requirements. In order to achieve good contact the coating may be cured in an oven after it is applied to the heat sink.

In FIG. 1 holes 4 and 5, where the electrical devices are to be attached, are shown open. The heat sink 3 is attached to the case of the power supply by an adhesive material 9. FIG. 1 shows this adhesive material overlapping the contact between the heat sink and the case. The adhesive material is also on the bottom of the supply case as indicated at brokenaway portion 23. The adhesive material in the exemplification embodiment was a commercially obtainable epoxy of the brand name Leebond No. 12-163-7 made by Leepoxy Plastics. Inc. This adhesive material contains silica granules from 0.002 to 0.003 inch in diameter to provide proper electrical spacing between the power supply case and the heat sink. The silica granules in the adhesive material in the exemplification embodiment may be brand name Glassgrain GP15 made by the Glassrock Corp. These grandules may constitute up to 3 percent of the material.

The remainder of the adhesive material may include 60 to 80 percent silica filler and from 40 to 20 percent epoxy formulation by weight.

The adhesive material thickness needed to achieve high voltage insulation (near 5000 volts) and adequate thermal conductivity in the exemplification embodiment was from 0.005 to 0.007 inch. The thermal resistance was between 0.220° to 0.336°C per watt inch squared for the adhesive material.

The tensil strength of the Leebond No. 12-163-7 used in the exemplification embodiment was 900 pounds per inch$^2$ and the dielectric strength was 300 volts per 0.001 inch. The viscosity of the Leebond was $2.5 \times 10^6$ centipoise at 25°C.

The adhesive material and the coating material may be both made of epoxys but they both must exhibit high electrical insulation and high thermal conductivity. Furthermore the adhesive material must also create a strong mechanical bond between the heat sink and the power supply case.

Figure 2:
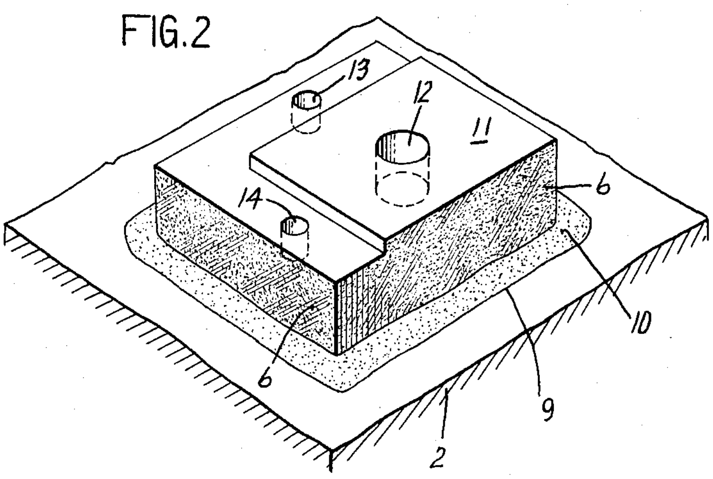
FIG. 2 is a diagram showing a solid block type heat sink attached to a power supply case.

FIG. 2 shows another form of the invention where the heat sink is a solid block of an aluminum being adhered to power supply case 1. The heat sink has hole 12 drilled partly into the block. Hole 12 is used to press fit a semiconductor device such as a triac. Holes 13 and 14 are further used to insert connector posts for two of the electrodes of the semiconductor device. The solid aluminum block heat sink is coated with the coating material 6 around the sides and on the bottom. This coating is again a thermally conductive and electrically insulating material. The heat sink is adhered to the power supply case again by the use of an adhesive material 9 having an epoxy base and silica granules indicated by dot 10.

Figure 3:
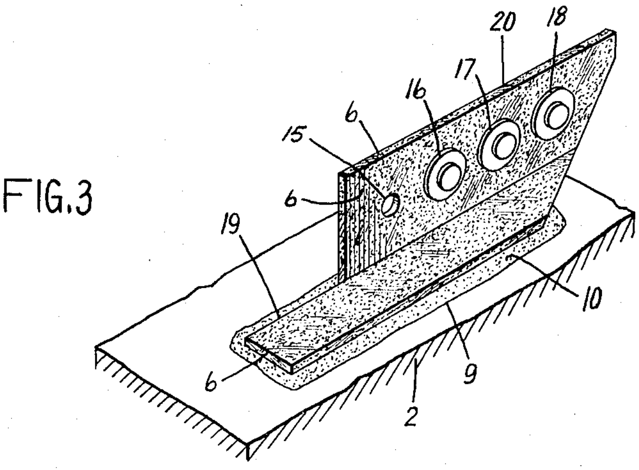
FIG. 3 is a diagram showing a L-shaped heat sink connected to a power supply case wherein solid state devices are mounted onto the heat sink.

FIG. 3 shows a heat sink which is L-shaped. The bottom member 14 is adhered to the case of the power supply in a similar manner to those of FIGS. 1 and 2. Side member 20 has mounting holes, an example of which is indicated by 15. The remaining mounting holes are covered by the transistors 16, 17, and 18 which may be glued onto the heat sink by the adhesive material. In the example in FIG. 3 the entire heat sink is covered by the fluidized bed coating so that the transistors 16, 17 and 18 are electrically isolated from one another. This isolation may be necessary because the transistors may operate at different potentials. The bottom part of the transistors may further have insulative slots or sleeves around them, however, this is not shown in FIG. 3.

The adhesive system, which includes the coating material and the adhesive material, has been built to withstand from 4200 to 7200 volts between the mounted electrical devices and the power supply case. The system can withstand from 880 to 1800 pounds per inch$^2$ mechanical pressure.

In making comparison tests between BaO wafers, mica wafers and applicant's coated adhesive system, a thermal conductivity standard of 1 thermal resistance was established for a BaO wafer which was one-half inch diameter and one-sixteenth inch thick. The thermal resistance of 1 square inch of mica 0.01 inch thick was 7. Using the fluidized bed coating, a 3 inch square 0.014 inch thick coating where the thickness relationship between the adhesive material and the fluidized bed coating was 6 to 8, a 4.2 thermal resistance was found.

Applicant has therefore found a system which is competitive with the wafers without their attending problems. Nuts and bolts are not needed for mounting either the semiconductor to the heat sink or the heat sink to the power supply case. The time consuming and often wasteful and dangerous wafer handling has been obviated, and the system is less expensive than the wafer system.

From the foregoing description of the illustrative embodiments of the invention it will be apparent that many modifications may be made therein. For example different types of epoxies for the adhesive materials may be used and different types of coatings may be used as long as they exhibit the properties of high thermal conductivity, high electrical strength and the adhesive material possesses a good mechanical bond. It will be understood that these embodiments of the invention are intended as exemplification of the invention only and that this invention is not limited thereto. It is also to be understood therefore that it is intended in the appended claims to cover all modifications that fall within the true spirit and scope of the invention.

What I claim is new and desire to be secure by Letters Patent in the United States is:

1. An apparatus for mounting at least one electrical device to a supportive surface comprising:

a heat sink for dissipating thermal energy;

means for mounting at least one electrical device to said heat sink; said heat sink having a first portion disposed toward said supportive surface; said first portion having a coating of a material exhibiting a high degree of electrical insulation and a high degree of thermal conductivity; an adhesive material situated between said coating on said first portion of said heat sink and a corresponding portion of said supportive surface for providing a mechanical bond between said heat sink and said supportive surface, said adhesive material exhibiting a high degree of electrical insulation and a high degree of thermal conductivity.

2. An apparatus as set forth in claim 1 wherein said adhesive material includes an epoxy formulation with electrically insulative granules for facilitating the provision of a predetermined spacing between said coating on said one portion of said heat sink and said supportive surface.

3. An apparatus as set forth in claim 1 wherein said adhesive material has a dielectric strength in the range of about 300 volts per 0.001 inch.

4. An apparatus as set forth in claim 1 wherein said adhesive material is an epoxy formulation having from about 60 to about 80 percent filler by weight and with about 3 percent by weight insulative granules added.

5. An apparatus as set forth in claim 1 wherein said adhesive material has a thermal resistance from 0.220° to 0.336°C per watt $inch^2$.

6. An apparatus as set forth in claim 1 wherein said coating is between about 0.006 inch and about 0.010 inch thick and has a dielectric strength of between about 500 volts and about 800 volts per 0.001 inch.

7. An apparatus as set forth in claim 1 wherein said coating includes an epoxy formulation having from about 35 to about 50 percent filler by weight.

8. An apparatus as set forth in claim 1 wherein said coating material has a thermal resistance range of 0.426° to 1.278°C per watt $inch^2$.

9. An apparatus as set forth in claim 1 wherein the electrical insulation from an electrical device mounted on said heat sink to said supportive surface will withstand a voltage within the range of 4200 to 7200 volts.

10. An apparatus as set forth in claim 1 wherein the mechanical bond strength of said adhesive material is between 880 pounds per $inch^2$ and 1800 pounds per $inch^2$.

11. Apparatus as set forth in claim 1 wherein said heat sink includes mountings for a plurality of electrical devices; said heat sink being substantially completely coated with said coating material for electrically insulating the plurality of semiconductors from one another.

12. An apparatus as set forth in claim 1 wherein said electrical devices are adhered to said heat sink by said adhesive material.

13. An apparatus for mounting at least one semiconductor device to a power supply case comprising:

a heat sink for supporting said at least one semiconductor device and for dissipating thermal energy, said heat sink having a first portion disposed adjacent said power supply case;

at least said first portion of said heat sink being coated with a coating material including epoxy and a silica filler, said coating material having a thermal resistance between about 0.426° and about 1.278°C per watt $inch^2$;

an adhesive material positioned between said coating on said first portion of said heat sink and a corresponding portion of said power supply case for mounting said heat sink to said power supply case; said adhesive material including epoxy and a silica filler, with silica granules added to facilitate the provision of a predetermined spacing between said coating on said first portion of said heat sink and said corresponding portion of said power supply case; said adhesive material having a thermal resistance between about 0.220° and about 0.336°C per watt $inch^2$;

said coating material together with said adhesive material providing a dielectric strength to withstand between about 4200 and about 7200 volts and a mechanical strength of between about 880 and about 1800 pounds per square inch.

14. An apparatus as set forth in claim 1 wherein at least selected other portions of said heat sink removed from said supportive surface also have a coating of said coating material.

* * * * *

UNITED STATES PATENT OFFICE
CERTIFICATE OF CORRECTION

Patent No. 3,846,824 Dated November 5, 1974

Inventor(s) Gordon M. Bell

It is certified that error appears in the above-identified patent and that said Letters Patent are hereby corrected as shown below:

In column 1, line 16, "beocmes" should read --becomes--.

In column 5, line 22, claim reference numeral "1" should read --3--.

Signed and sealed this 18th day of February 1975.

(SEAL)
Attest:

RUTH C. MASON
Attesting Officer

C. MARSHALL DANN
Commissioner of Patents
and Trademarks